United States Patent [19]

Buckley et al.

[11] Patent Number: 5,660,920

[45] Date of Patent: Aug. 26, 1997

[54] INTER-LEVEL DIELECTRICS WITH LOW DIELECTRIC CONSTANTS

[75] Inventors: Leonard J. Buckley, Springfield; Arthur W. Snow, Alexandria, both of Va.; James R. Griffith, Lanham, Md.; Mark Ray, Cary, N.C.

[73] Assignee: The United States of America as represented by the Secretary of the Navy, Washington, D.C.

[21] Appl. No.: 422,463

[22] Filed: Jul. 14, 1995

[51] Int. Cl.$^6$ ................................................ B32B 9/00
[52] U.S. Cl. .......................... 428/209; 428/901; 428/447; 257/632
[58] Field of Search .................................. 428/209, 901, 428/210, 447; 257/632; 528/31, 42, 422; 556/448; 526/242, 247

[56] References Cited

U.S. PATENT DOCUMENTS

| | | | |
|---|---|---|---|
| 5,099,053 | 3/1992 | Takaoka | 556/448 |
| 5,292,927 | 3/1994 | Griffith et al. | |
| 5,389,497 | 2/1995 | Yoshioka | 430/315 |
| 5,468,790 | 11/1995 | Papathomas | 528/422 |

OTHER PUBLICATIONS

Hu et al., Fluoropolymers With Low Dielectric Constants: Triallyl Ether–Hydrosiloxane Resins.

Hu et al., Fluoropolymers With Low Dielectric Constants: Acrylates and Epoxies.

Hu et al., Processable Fluoropolymers With Low Dielectric Constants. 7. Epoxy Networks From a Fluorodiimidediol.

Hu et al., Polym. Mat. Sci. Eng., 72, 446–447 (1995).

Buckley et al., Low Dielectric Constant Thermosetting Resins For Microelectronics.

*Primary Examiner*—Patrick Ryan
*Assistant Examiner*—Patrick Jewik
*Attorney, Agent, or Firm*—Thomas E. McDonnell; Barry Edelberg

[57] ABSTRACT

A metallization is coated with a network polymer. The network polymer may be either a cross-linked polyfluorinated polyallylether-polyhydromethylsiloxane copolymer or a network polymer formed from cross-linked fluoromethylene cyanate ester monomers. These polymer networks are resistant to the diffusion of a metallization, such as copper, therethrough.

11 Claims, 3 Drawing Sheets

INTER-LEVEL DIELECTRICS WITH LOW DIELECTRIC CONSTANTS

BACKGROUND OF THE INVENTION

1. Field of the Invention

The present invention relates to generally to inter-levels and more specifically to inter-levels with good resistance to the diffusion of a metallization therethrough.

2. Description of the Background Art

As circuit technology continues to advance, factors affecting the performance of the interconnect system become increasingly important. A larger portion of the total circuit delay will be caused by the resistance and capacitance of the interconnect system. To address these issues, copper, with its relatively low resistivity, and various polymers, with low dielectric constants and attractive processabilities, have been proposed. Of the many low dielectric constant polymers currently being studied, polyimides are the most mature with respect to processing and process integration. There are problems associated with polyimides such as moisture absorption which acts to increase the dielectric constant, dielectric anisotropy, and copper ion diffusion. Previous studies using SIMS (Secondary Ion Mass Spectroscopy) indicated copper to move rapidly throughout polyimide spin cast films. When copper diffuses as a singly charged positive ion through the dielectric the insulating capacitance is compromised. Another set of resin systems based on benzocyclobutenes have shown resistance to copper ion diffusion with relatively low dielectric constants. A need exists for even lower dielectric constant resins that can be used as inter-level insulators with copper metallization.

SUMMARY OF THE INVENTION

Accordingly, it is an object of this invention to coat metallizations with a low dielectric constant material resistant to moisture absorption.

It is a further object of the present invention to coat metallization with a low dielectric constant material resistant to the diffusion of the metallization therethrough.

These and additional objects of the invention are accomplished by coating the metallization with a layer of a polyfluorinated polyallylether-polyhydromethylsiloxane copolymer.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

Figure 1:
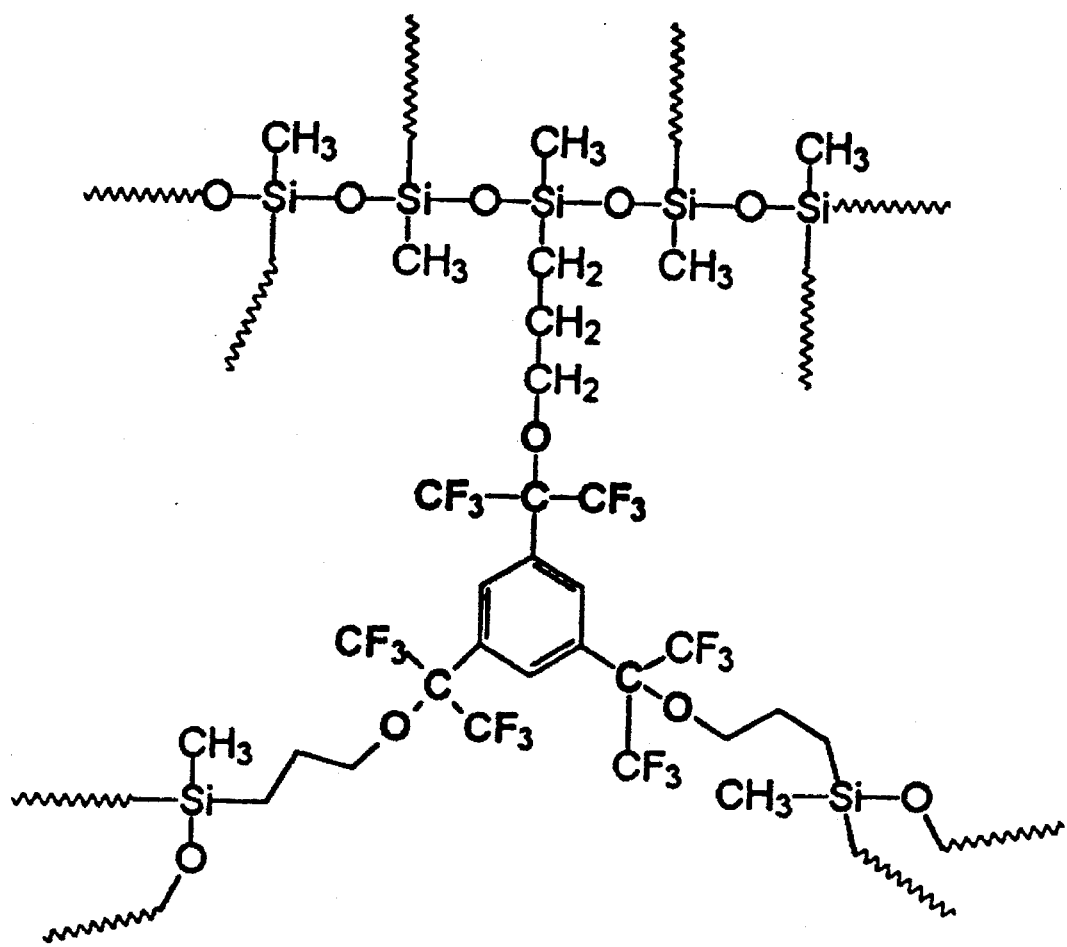
FIG. 1 shows a cross-linked fluoroaromatic triallyl-ether network copolymer (TAE) useful as a dielectric coating according to the present invention.

The copolymer used in the present invention may be any polyfluorinated polyallylether-polyhydromethylsiloxane copolymer. One typical copolymer, which is thermosetting, has the structure represented by FIG. 1a. In FIG. 1a, following standard practices in drawing the structure of network polymers, the wavy lines represent the continuous repeating nature of the network copolymer.

A typical synthesis and curing procedure for the copolymer shown in FIG. 1a is disclosed in Hu et al., *Polym. Mat. Sci. Eng.*, 72, 446–447, the entirety of which is incorporated herein by reference for all purposes. Typically, a thermal cure is used.

Basically, the network polymer of FIG. 1a may be made according to the following reaction scheme:

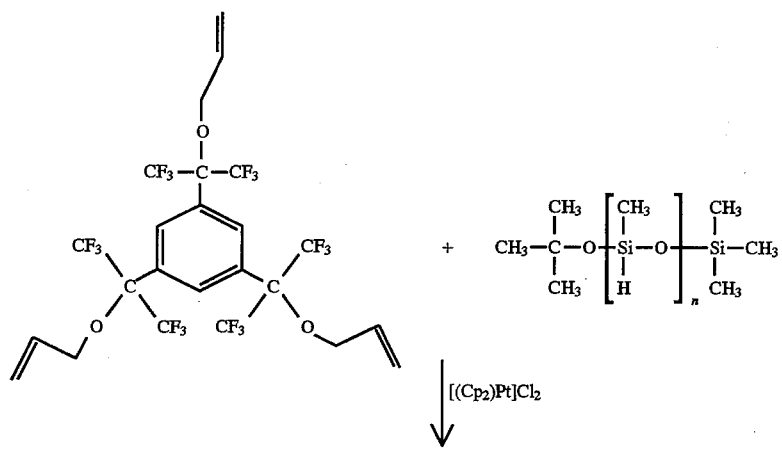

-continued

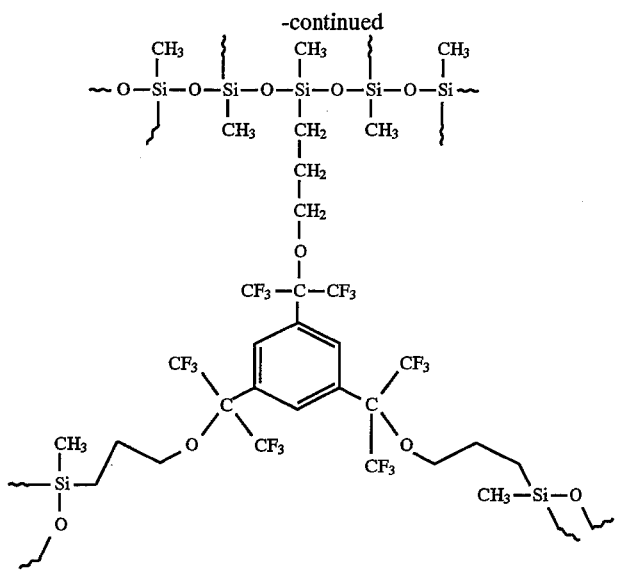

where n is at least one but is an integer sufficiently small that the polymethylhydrosiloxane component is a liquid before copolymerization and the uncured polymer mixture is a liquid.

For best results, the uncured polymer mixture should have a viscosity that permits it to be spun onto the metallization without the need for a diluent. The uncured polymer mixture may be coated on the metallization layer by any suitable method known in the art. Typically, the uncured copolymer mixture is coated on the metallization by spin casting.

Any other well-known hydrosilylation scheme may be used for copolymerization of the polymer mixture on the metallization. The use of a catalyst, shown above, while not required, greatly increases the rate of copolymerization. Rather than dicyclopentadienylplatinum chloride, a similarly behaving catalyst may be used. Also, other halide salts, of the dicyclopentadienylplatinum complex cation may be selected. For example dicyclopentadienylplatinum bromide should also be an effective catalyst for the copolymerization. Also, the platinum component of the dicyclopentadienylplatinum complex cation may be replaced with rhodium. For example dicyclopentadienylrhodium chloride or dicyclopentadienylrhodium bromide may be used in the above copolymerization in place of dicyclopentadienylplatinum chloride. Typically, only a trace amount of catalyst is needed for effective catalytic action. The temperature for copolymerization depends on the workpiece upon which the polymer mixture is coated. For example, the copolymerization temperature may be depend on the thermal stability of the substrate over which the metallization has been placed. Typically, the temperature during copolymerization is slowly (over about two days) raised from room temperature to at least about 125° C. (more typically at least about 150° C.). Then the coated workpiece is maintained at that elevated temperature for an amount of time sufficient to complete copolymerization (for example, about an hour). The hydrosilylation of siloxane-containing polymers is discussed in Crivello et al., *Polym Sci. Part A Polym. Chem. Ed.* 1993, 31, 2729, the entirety of which is incorporated herein by references for all purposes, and in Mathias et al., *Macromolecules* 1993, 26, 4070, the entirety of which is incorporated herein by reference for all purposes.

Typically, the polymer mixture from which the copolymer is made includes essentially equimolar amounts of the polyfluorinated polyallylether and polyhydromethylsiloxane components. Deviation from equimolar amounts of the two components may significantly reduce the thermal stability of the copolymer obtained therefrom.

The synthesis of the polyfluorinated polyallylether component:

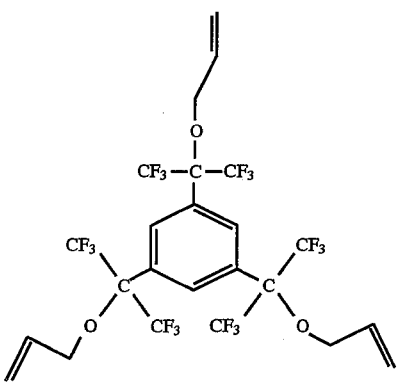

is described in U.S. Pat. No. 5,292,927, issued March 8, 1994, to Griffith et al., the entirety of which is incorporated by reference herein for all purposes.

Any substrate material suitable for the metallization, and thermally stable to the curing temperatures employed, may be used in the present invention. Typical substrates for microelectronics include silicon, silicon oxide, silicon dioxide, silicon nitride, silicon carbide, gallium arsenide, aluminum gallium arsenide, and aluminum nitride. The most typical substrates are silicon and silicon dioxide.

Having described the invention, the following examples are given to illustrate specific applications of the invention including the best mode now known to perform the invention. These specific examples are not intended to limit the scope of the invention described in this application.

EXAMPLES

Experimental

The fluoroaromatic triol was prepared by a multistep route according to a procedure described in Luther et all, *VMI Conference Proceedings*, 15, 1993, the entirety of which is incorporated herein by reference for all purposes. The triallyl ether (TAE) was prepared from the triol and allyl bromide, as described in Hu et al., *Polym. Mat. Sci. Eng.*, 72,446–447. An equimolar copolymer of the triallyl ether with polymethylhydrosiloxane (several molecular weights) was thermally cured via hydrosilylation using a trace amount of dicyclopentadienylplatinum chloride. The cure temperature varied with the form of the material sample (i.e. thin film on a silicon wafer or bulk resin). The curing reaction was monitored via FT-IR by following the disappearance of the Si—H absorption peak (2171 cm$^{-1}$). wafers using a Brewer Science spin coater under a variety of conditions. For the planarization study, 0.5 micron thick Al features were fabricated on Si wafers using an Al liftoff process. The features examined varied from 0.5 to 12 microns in width. Both isolated and non-isolated features were investigated. A 1.5 micron thick polymer layer was then deposited and the degree of planarization was determined.

The thickness measurements were obtained from cross-sectional SEM photos using a Hitachi Field Emission SEM. Reactive ion etching (RIE) studies of the materials were carried out in a magnetically enhanced reactive ion etching system (MERIE). The samples were etched in the split-cathode MERIE system using a 10% $CF_4$/90% $O_2$ plasma. The total pressure was 2 mTorr and the plasma powers examined ranged from 1 kW to 2.5 kW. The etching rates were determined from profilometry measurements of an etch step that was fabricated by covering part of the polymer with a glass slide. The etching rates were compared to photoresists for the purpose of fabrication of submicron vias in the new materials. Compatibility of the TAE polymer with copper was studied using a Perkin-Elmer 6300 Secondary Ion Mass Spectroscopy (SIMS) system on polymer films deposited onto copper-coated silicon substrates.

Results and Discussion

Figure 2A:
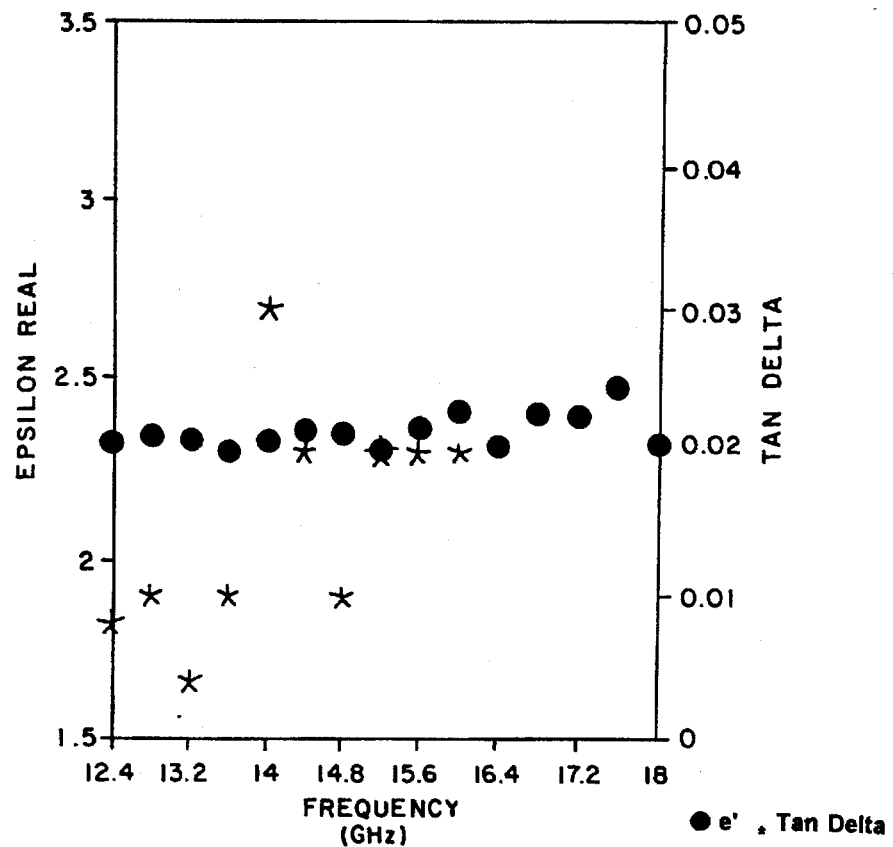
FIGS. 2a and 2b are graphs showing the complex permittivity of TAE at $K_u$ and $K_a$ bands, respectively.
Figure 2B:
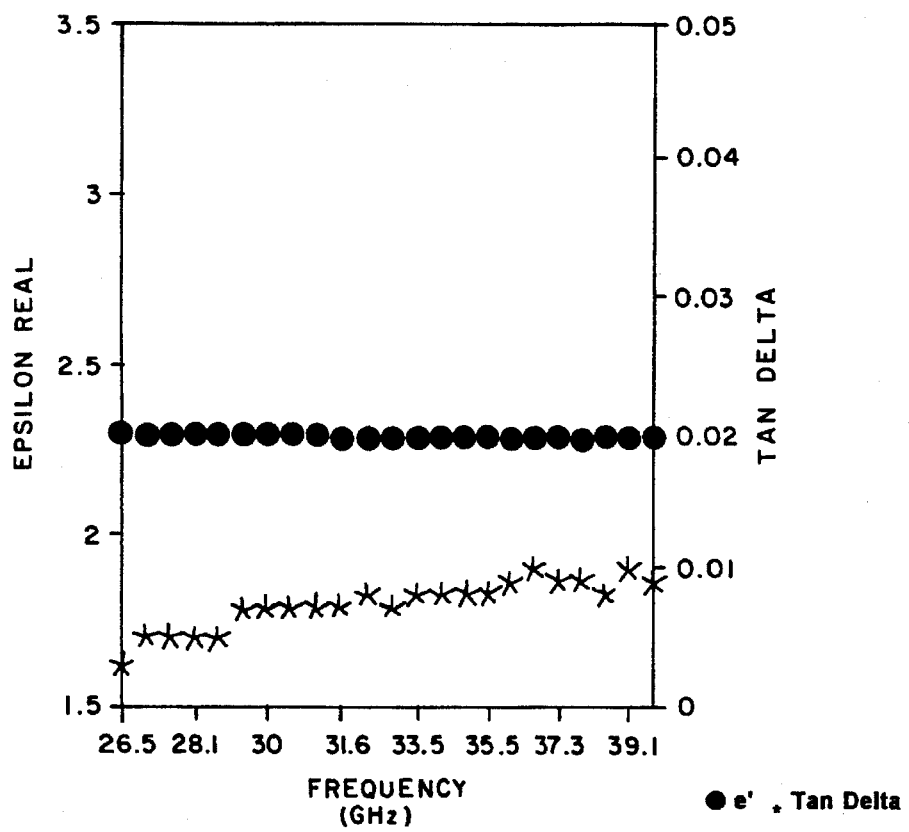

Samples of the TAE polymer were produced in bulk and thin film forms. FT-IR of thin films deposited onto NaCl plates showed a high level of conversion (i.e. disappearance of 2171 cm−1 peak) when cured for 2 hours at 150 degrees C. Bulk rectangular samples were prepared for complex permittivity measurements. FIGS. 2a and 2b show the results for $K_u$ and $K_a$ bands, respectively. The value of ca. 2.36 is low compared to other thermosets that are commercially available. The polymethylhydrosiloxane for this sample had an average molecular weight of 390.

Figure 3:
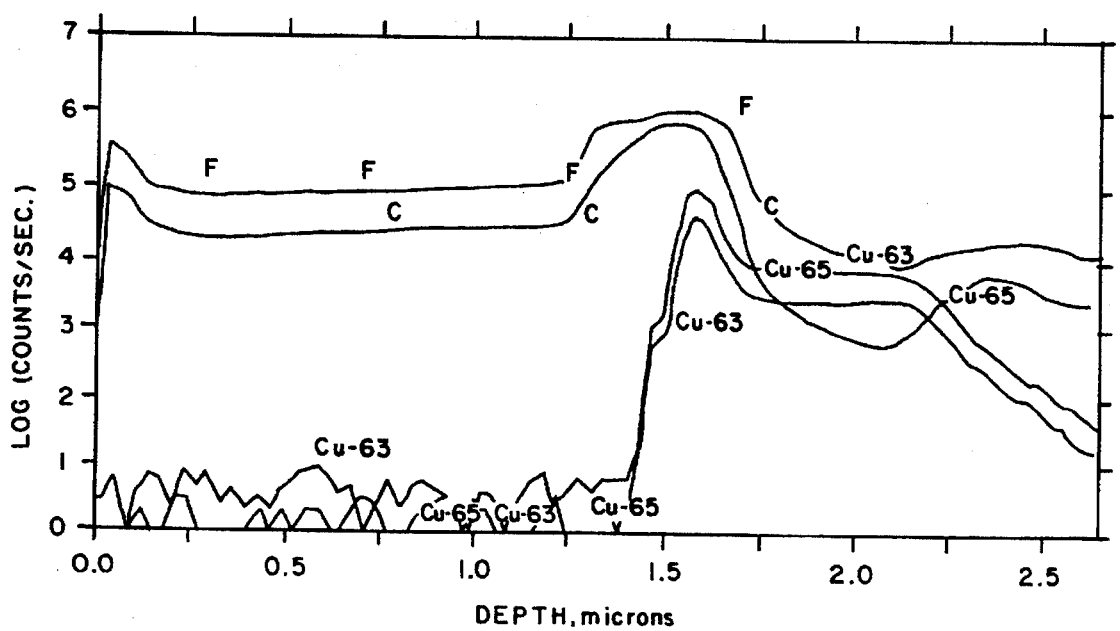
FIG. 3 is a SIMS depth profile of TAE on Cu-coated Si.

The SIMS depth profile, shown in FIG. 3, is for a 2 micron thick TAE film on a Cu-coated Si substrate. The film was spin cast and cured at 150° C. in nitrogen on the Cu-coated substrate. The sample was profiled using a 7 keV Cs+ beam with simultaneous electron flooding to remove any sample charging. The SIMS data clearly shows the abrupt interface between the TAE polymer and the Cu with no Cu present in the TAE film. Both isotopes of Cu are present in the profile in order to identify any interferences; however, none occurred. These results indicate a resistance to Cu migration. Cu does migrate readily through other polymeric materials used for inter-level dielectrics, such as polyimides. One notable inter-level dielectric structure has been made using Cu and polyimides. However, the Cu was encapsulated with $Si_3N_4$ which prevented any migration of the Cu into the polymer and protected the Cu from corrosion during processing. To maintain the advantages of lower dielectric constants, these ILD structures must have extremely thin encapsulating layers. As device geometries shrink, the thin encapsulating layer becomes more important and more difficult to maintain. Resistance of Cu migration into the ILD structure provides added processing latitude when using encapsulating layers.

Figure 4:
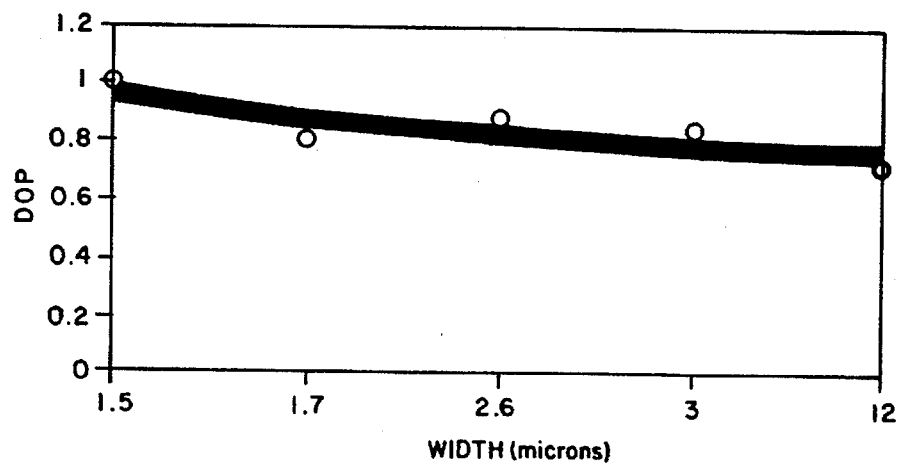
FIG. 4 is a graph showing the degree of planarization (DPO) vs. aluminum feature width.

The degree of planarization (DOP) for the spin cast TAE films is shown in FIG. 4. Planarization is an important advantage for polymer inter-level dielectrics since they may reduce the number of processing steps required to achieve a flat dielectric layer. The TAE films showed excellent planarization over all the structures as well as excellent gap filling down to 0.5 micron gaps. No voids were observed in any of the structures examined. This DOP was achieved without any optimization of the curing or spin dynamics. Further examination of the DOP and process optimization will yield better planarization than is currently seen.

Reactive ion etching of the TAE polymer films was accomplished using a mixture of $CF_4$ and $O_2$. The MERIE system was designed with polymer etching in mind and has very low operating pressures and very little ion damage, even when operated at 2.5 kW. Etch rates for 2 kW operation were 200 nm/minute. A linear relationship between the power supplied to the plasma and the etching rate (for a fixed gas composition and pressure) was readily obtained. The 10% $CF_4$ was added to the plasma because of the high Si content in the TAE film due to the copolymerization with PMHS. The Si interface was examined in the SEM after etching and found to be smooth and even with no residue left from the etched polymer layer. No attempt was made to optimize the etching rate and to determine the best etch chemistry for vertical etch profiles. However, from previous experience with polymer etching, it appears that this material can easily be etched to provide high quality vertical walled vias.

Obviously, many modifications and variations of the present invention are possible in light of the above teachings. It is therefore to be understood that, within the scope of the appended claims, the invention may be practiced otherwise than as specifically described.

What is claimed is:

1. A integrated circuit comprising:
   a substrate;
   a metallization over and in physical contact with an upper surface of said substrate;
   a layer of a polyfluorinated polyallylether-polyhydromethylsiloxane network copolymer over and in physical contact with an upper surface of said metallization.

2. The integrated circuit of claim 1, wherein said copolymer is made by copolymerization of essentially equimolar amounts of a polyfluorinated polyallylether component and a polyhydromethylsiloxane component.

3. The integrated circuit of claim 1 wherein said upper surface of said substrate is selected from the group consisting of silicon and silicon dioxide.

4. The integrated circuit of claim 1, wherein said copolymer is made by copolymerization of a polyhydromethylsiloxane with a polyfluorinated polyallylether having the structure:

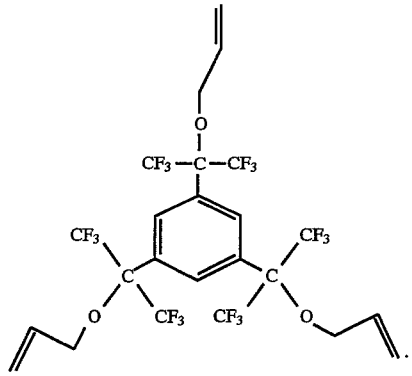

5. The integrated circuit of claim 4, wherein said polyhydromethylsiloxane copolymer has the structure:

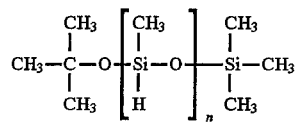

wherein n is an integer having a value of at least one and wherein said polyhydromethylsiloxane is a liquid.

6. The integrated circuit of claim 1, wherein said copolymer layer is from about 0.1 to about 10 microns thick.

7. The integrated circuit of claim 6, wherein said copolymer layer is from about 0.5 to about 10 microns thick.

8. The integrated circuit of claim 1, wherein said metallization is selected from the group consisting of copper and aluminum.

9. The integrated circuit of claim 8, wherein said metallization is copper.

10. The integrated circuit of claim 1, wherein said copolymer layer is spin-coated onto said metallization.

11. The integrated circuit of claim 1, wherein said copolymer is a fully cross-linked, thermally cured network polymer.

* * * * *